(12) United States Patent
Lin

(10) Patent No.: US 9,887,200 B2
(45) Date of Patent: Feb. 6, 2018

(54) DYNAMIC RANDOM ACCESS MEMORY

(71) Applicant: Winbond Electronics Corp., Taichung (TW)

(72) Inventor: Chih-Hao Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/247,950

(22) Filed: Aug. 26, 2016

(65) Prior Publication Data

US 2017/0125423 A1 May 4, 2017

(30) Foreign Application Priority Data

Nov. 3, 2015 (CN) .......................... 2015 1 0734345

(51) Int. Cl.
*H01L 27/108* (2006.01)
*H01L 49/02* (2006.01)

(52) U.S. Cl.
CPC .. *H01L 27/10823* (2013.01); *H01L 27/10814* (2013.01); *H01L 28/87* (2013.01); *H01L 28/91* (2013.01)

(58) Field of Classification Search
CPC .......... H01L 27/108–27/10826; H01L 27/10844–27/10858; H01L 27/10873–27/10897; H01L 27/1023; H01L 27/11; H01L 2924/1435–2924/14369
See application file for complete search history.

(56) References Cited

U.S. PATENT DOCUMENTS

| 6,787,838 B1 | 9/2004 | Chidambarrao et al. |
| 2016/0204201 A1* | 7/2016 | Oh ...................... H01L 29/1041 257/330 |

FOREIGN PATENT DOCUMENTS

TW 200816223 4/2008

OTHER PUBLICATIONS

"Office Action of Taiwan Counterpart Application," dated Jan. 24, 2017, p. 1-p. 5, in which the listed references were cited.

* cited by examiner

*Primary Examiner* — Cuong B Nguyen
(74) *Attorney, Agent, or Firm* — JCIPRNET

(57) ABSTRACT

A dynamic random access memory (DRAM) includes a substrate, isolation structures, buried word lines, bit lines, and capacitors. The substrate includes active areas configured into strips and arranged as an array. The isolation structures are disposed in trenches of the substrate. Each isolation structure is disposed between two adjacent active areas. The buried word lines are disposed in parallel in a first direction in the trenches. Each buried word line divides each active area arranged in the same column into a first contact region and a second contact region. The bit lines are disposed in parallel in a second direction on the substrate and across the buried word lines. A longitudinal direction of the active areas is non-orthogonal to the second direction. Each bit line is electrically connected with the first contact regions in the same row. The capacitors are electrically connected with the corresponding second contact regions respectively.

10 Claims, 4 Drawing Sheets

DYNAMIC RANDOM ACCESS MEMORY

CROSS-REFERENCE TO RELATED APPLICATION

This application claims the priority benefit of China application serial no. 201510734345.4, filed on Nov. 3, 2015. The entirety of the above-mentioned patent application is hereby incorporated by reference herein and made a part of this specification.

BACKGROUND OF THE INVENTION

Field of the Invention

The invention relates to a memory device and particularly relates to a dynamic random access memory with buried word lines.

Description of Related Art

A dynamic random access memory (DRAM) is a volatile memory formed by a plurality of memory cells. Each of the memory cells is mainly composed of a transistor and a capacitor controlled by the transistor, and the memory cells are electrically connected with one another through word lines and bit lines.

In order to improve the integration of DRAM to increase the operating speed of the device and to meet the consumers' demand for miniaturization of electronic devices, buried word line DRAM has been developed in recent years for such purposes.

A dominant layout of the currently used DRAM is that two memory cells share one bit line contact and the two memory cells are controlled by two word lines respectively. However, when the word line of one of the memory cells is turned on/off for controlling one of the memory cells, the other memory cell that shares the bit line contact with the aforementioned memory cell may be interfered with easily. In such circumstances, the interference will become more serious if the memory cell feature size is miniaturized (that is, the distance between the memory cells is shortened).

In addition, since the pitch between the word lines is only one feature size, when the word line is drawn to the edge of the memory cell array for fabricating a word line pick up contact, short circuit may easily occur between the word line pick up contact and the word line during the fabrication. One conventional method is to separate two adjacent word lines by a distance at the end to form an approximately Y-shaped structure, so as to increase the process window for fabricating the contact. However, such a method will occupy additional area on the edge of the memory cell array and cause the chip size to increase. Furthermore, the design of pick up contacts from both ends of the word line to the edge of the memory cell array will not be applicable. Thus, loss due to broken word lines cannot be reduced.

Moreover, capacitor contacts are respectively disposed on two ends of the memory cell layout and the bridge window for the capacitor contacts is determined by the pitch between two adjacent capacitor contacts. According to the current layout, the pitch between two adjacent capacitor contacts is only one feature size (1F). Due to the limitation of the layout design, as the fabrication is miniaturized, the bridge window for the capacitor contacts will become even smaller.

SUMMARY OF THE INVENTION

The invention provides a dynamic random access memory (DRAM), which effectively reduces interference between memory units and increases the process window.

The dynamic random access memory of the invention includes a substrate, a plurality of isolation structures, a plurality of buried word lines, a plurality of bit lines, and a plurality of capacitors. The substrate includes a plurality of active areas. The active areas are configured into strips and arranged as an array. The isolation structures are disposed in trenches of the substrate. Each of the isolation structures is disposed between two adjacent active areas. The buried word lines are disposed in parallel in a first direction in the trenches of the substrate. Each of the buried word lines divides the active areas arranged in the same column into a first contact region and a second contact region. The bit lines are disposed in parallel in a second direction on the substrate and across the buried word lines. A longitudinal direction of the active areas is non-orthogonal to the second direction. Each of the bit lines is connected with the first contact regions of the active areas in the same row. The capacitors are electrically connected with the second contact regions of the active areas respectively.

In an embodiment of the invention, an angle between the longitudinal direction of the active areas and the second direction is in a range of 15° to 50°.

In an embodiment of the invention, the adjacent active areas have a pitch of one feature size therebetween in the first direction.

In an embodiment of the invention, the active areas in two adjacent columns are arranged in a mirrored configuration.

In an embodiment of the invention, two first contact regions or two second contact regions are disposed between the adjacent buried word lines.

In an embodiment of the invention, a pitch between the adjacent buried word lines is greater than one feature size, and the adjacent active areas have a pitch of one feature size therebetween in the first direction.

In an embodiment of the invention, two end parts of one active area are arranged in parallel to two end parts of the adjacent active area in the first direction.

In an embodiment of the invention, the second contact regions of the active areas in one column are arranged staggeredly with the first contact regions of the active areas in another adjacent column.

In an embodiment of the invention, the dynamic random access memory further includes a plurality of capacitor contacts. The capacitor contacts are disposed between the capacitors and the second contact regions to electrically connect the bit lines and the second contact regions.

In an embodiment of the invention, the dynamic random access memory further includes a plurality of bit line contacts. The bit line contacts are disposed between the bit lines and the first contact regions to electrically connect the capacitors and the first contact regions.

Based on the above, in the dynamic random access memory of the invention, one memory unit is formed on one active area, and the memory units are separated by the device isolation structure. Therefore, interference between the memory units is reduced effectively. The adjacent buried word lines have a larger pitch therebetween. Thus, the word line pick up contacts are disposed on the edge of the memory cell array corresponding to both ends of the buried word line, so as to reduce loss when the buried word lines are broken and increase the process window for the word line pick up contacts. Moreover, if the second contact regions of the active areas in one column are arranged staggeredly with the first contact regions of the active areas in another column adjacent thereto, the size of the memory may be reduced.

To make the aforementioned and other features and advantages of the invention more comprehensible, several embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Please refer to the attached figures in the following disclosure to better understand the concept of the invention. Several embodiments of the invention are illustrated in the figures. Nevertheless, the invention may be embodied in many different forms and should not be construed as limited to the embodiments set forth hereinafter. In fact, the embodiments are provided to disclose the invention more thoroughly and completely and fully convey the scope of the invention to persons skilled in the art.

In the figures, for clarity, the sizes of the layers and regions and their relative sizes may not be drawn to scale.

Figure 1A:
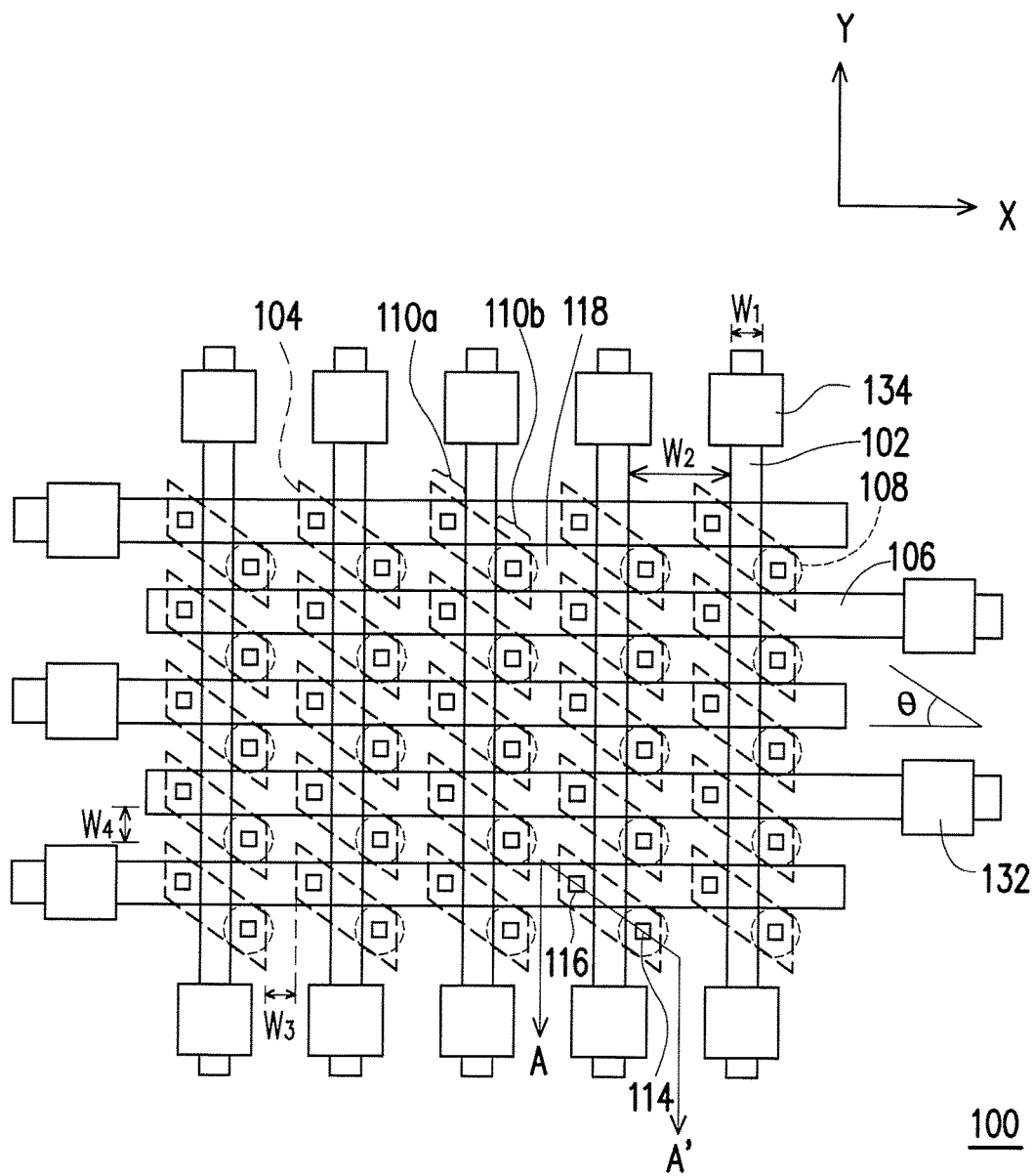
FIG. 1A is a layout diagram of a dynamic random access memory according to the first embodiment of the invention.
Figure 1B:
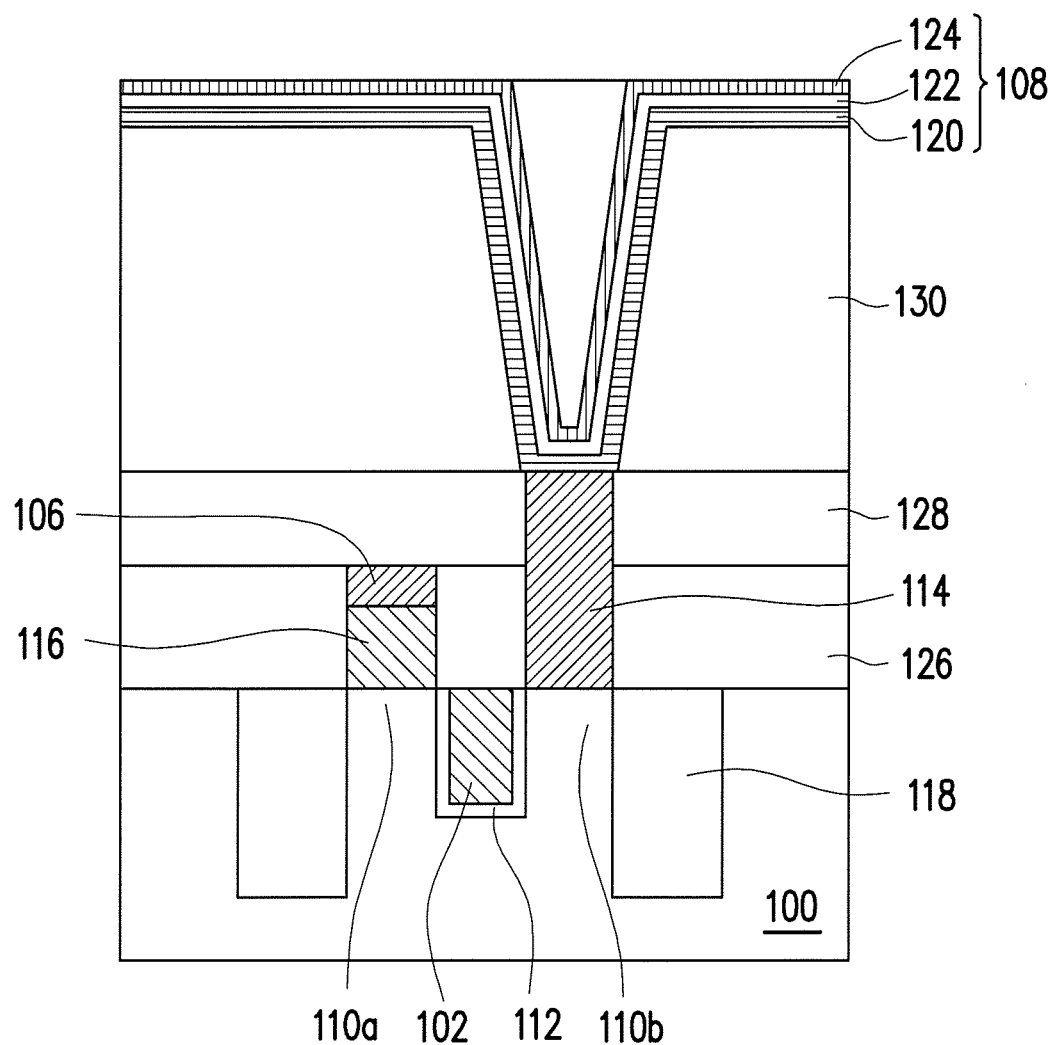
FIG. 1B is a cross-sectional diagram taken along the line section A-A' of FIG. 1A.

FIG. 1A is a layout diagram of a dynamic random access memory according to the first embodiment of the invention. FIG. 1B is a cross-sectional diagram taken along the line section A-A' of FIG. 1A. FIG. 1B illustrates a structure of a single memory unit.

With reference to FIG. 1A and FIG. 1B, the dynamic random access memory of this embodiment includes a substrate 100, a plurality of buried word lines 102, a plurality of bit lines 106, and a plurality of capacitors 108.

The buried word lines 102 are disposed in parallel in a Y direction (a column direction) in trenches of the substrate 100. A material of the buried word lines 102 is a metal conductor, such as tungsten, tungsten silicide, and titanium nitride, for example. A forming method of the buried word lines 102 is physical vapor deposition, chemical vapor deposition, or atomic layer vapor deposition, for example. An insulating layer 112 is further disposed between the buried word line 102 and the substrate 100 to serve as a gate dielectric layer, as shown in FIG. 1B. A material of the insulating layer 112 is silicon oxide, for example, and a forming method thereof includes performing a thermal oxidation process in a furnace tube.

The bit lines 106 are disposed in parallel in an X direction (a row direction) on the substrate 100 and across the buried word lines 102. A material of the bit lines 106 is a transition metal conductor, such as tungsten, tungsten silicide, and titanium nitride, for example. A forming method of the bit lines 106 is physical vapor deposition, chemical vapor deposition, or atomic layer vapor deposition, for example. The buried word lines 102 and the bit lines 106 are perpendicular to one another, for example.

The substrate 100 includes a plurality of active areas 104. The active areas 104 are configured into strips and arranged as an array. A longitudinal direction of the active areas 104 is non-orthogonal to the X direction and forms an angle θ. Each of the buried word lines 102 divides each of the active areas 104 arranged in the same column into a first contact region 110a and a second contact region 110b. A plurality of isolation structures 118 are disposed between the active areas 104, for example.

Each of the bit lines 106 is electrically connected with the first contact regions 110a of the active areas 104 in the same row. That is, while each of the bit lines 106 is disposed across the buried word lines 102 on the substrate 100, the first contact regions 110a on a side of the buried word line 102 are electrically connected by a bit line contact 116 (as shown in FIG. 1B) respectively, for example.

The angle θ between the longitudinal direction of the active areas 104 and the X direction is in a range of 15° to 50°, but the invention is not limited thereto. The range of the angle θ may be affected by parameters, such as the area of the active area 104, a linewidth of the bit line 106, a linewidth of the buried word line 102, and so on. In addition, although the bit line contact 116 is rectangular in FIG. 1A, it may be substantially circular in fact, and the size of the bit line contact 116 may be increased or decreased according to the fabricating process.

The capacitors 108 are electrically connected with the second contact regions 110b of the active areas 104 respectively. The capacitor 108 is usually disposed in the insulating layer 130 on the substrate 100. The capacitor 108 is a stack capacitor, including a conductive layer 120, a dielectric layer 122, and a conductive layer 124, for example. The conductive layers 120 and 124 are TiN (or TiN/SiGe), for example. The dielectric layer 122 may be a dielectric material, such as ZAZ (i.e. $ZrO_2/Al_2O_3/ZrO_2$) and is suitable for DRAM of 60 nm or less.

Each of the capacitors 108 is electrically connected with the second contact region 110b on the other side of the buried word line 102 through a capacitor contact 114. In addition, although the capacitor contact 114 is rectangular in FIG. 1A, it may be substantially circular in fact, and the size of the capacitor contact 114 may be increased or decreased according to the fabricating process.

In addition to the structure illustrated in FIG. 1A, it is known from FIG. 1B that the buried word line 102 is disposed in the trench of the substrate 100. The capacitors 108, the capacitor contacts 114, the bit lines 106, the bit line contacts 116, and so on on the substrate 100 are usually separated by insulating layers 126, 128, and 130. The insulating layers 126, 128, and 130 include an insulating material, such as SiO2, SiN, and BPSG, for example. A memory unit is disposed in each of the active areas 104. The memory unit includes the buried word line 102, the insulating layer 112, the bit line 106, the bit line contact 116, the capacitor 108, and the capacitor contact 114.

In each of the active areas 104 of this embodiment, the first contact region 110a is electrically connected with one bit line 106, and the second contact region 110b is electrically connected with one capacitor 108. As shown in FIG. 1A, a linewidth W1 of the buried word line 102 is a pitch of about one feature size (1F); and a pitch W2 between the buried word lines 102 is about three feature sizes (3F). In the X direction, a pitch W3 between the active areas 104 is about one feature size (1F). In the Y direction, a pitch W4 between the active areas 104 is about one feature size (1F). Moreover, on an edge of the memory cell array, a word line pick up contact 134 electrically connected with the buried word lines 102 and a bit line pick up contact 132 electrically connected with the bit lines 106 are disposed. The word line pick up contact 134 is disposed corresponding to two ends of the buried word line 102.

In the embodiment described above, one memory unit is formed on one active area 104, and the memory units are separated by the isolation structure 118. Therefore, interference between the memory units is reduced effectively. Moreover, two adjacent buried word lines 102 have the pitch W2 of three feature sizes (3F) therebetween. Thereby, the word line pick up contacts 134 are formed on the edge of the memory cell array corresponding to both ends of the buried word line 102, so as to reduce loss when the buried word lines 102 are broken and increase the process window for the word line pick up contacts 134.

Figure 2:
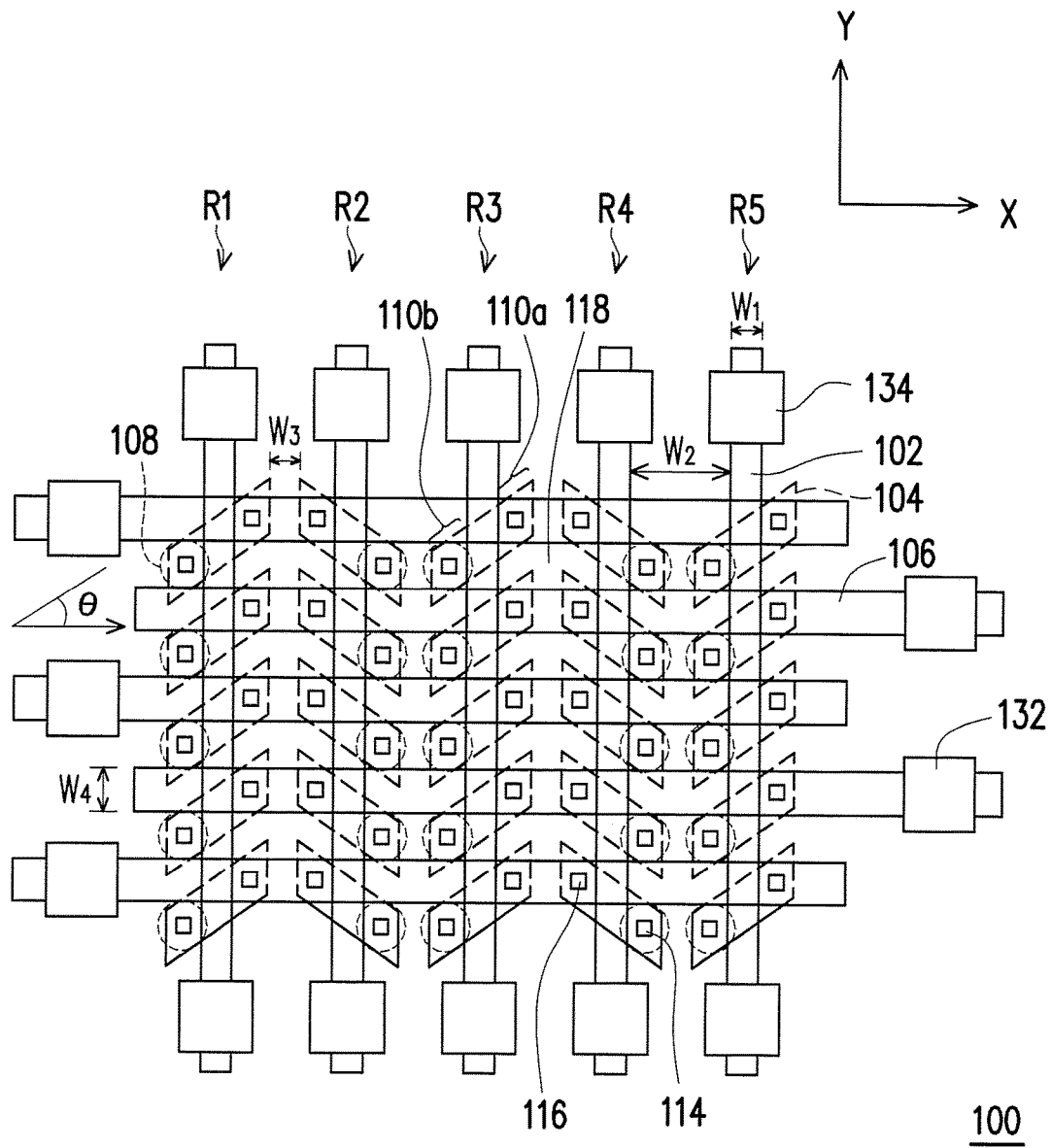
FIG. 2 is a layout diagram of a dynamic random access memory according to the second embodiment of the invention.

FIG. 2 is a layout diagram of a dynamic random access memory according to the second embodiment of the invention. Components of the second embodiment that are the same as those of the first embodiment, are assigned with the same reference numerals and thus detailed descriptions thereof are omitted hereinafter. The following describes the difference therebetween.

As shown in FIG. 2, the substrate 100 includes a plurality of active areas 104. The active areas 104 are configured into strips and arranged as an array. In this embodiment, the active areas 104 are arranged into five active area columns R1-R5, and two adjacent active area columns are arranged in a mirrored configuration. For example, the longitudinal direction of the active area columns R1, R3, and R5 is non-orthogonal to the X direction and forms the angle θ. The longitudinal direction of the active area columns R2 and R4 is non-orthogonal to the X direction and forms an angle (180°-θ). Two first contact regions 110a or two second contact regions 110b are disposed between two adjacent buried word lines 102.

In the embodiment described above, one memory unit is fanned on one active area 104, and the memory units are separated by the isolation structure 118. Therefore, interference between the memory units is reduced effectively. Moreover, two adjacent buried word lines 102 have the pitch W2 of three feature sizes (3F) therebetween. Thereby, the word line pick up contacts 134 are formed on the edge of the memory cell array corresponding to both ends of the buried word line 102, so as to reduce loss when the buried word lines 102 are broken and increase the process window for the word line pick up contacts 134.

Figure 3:
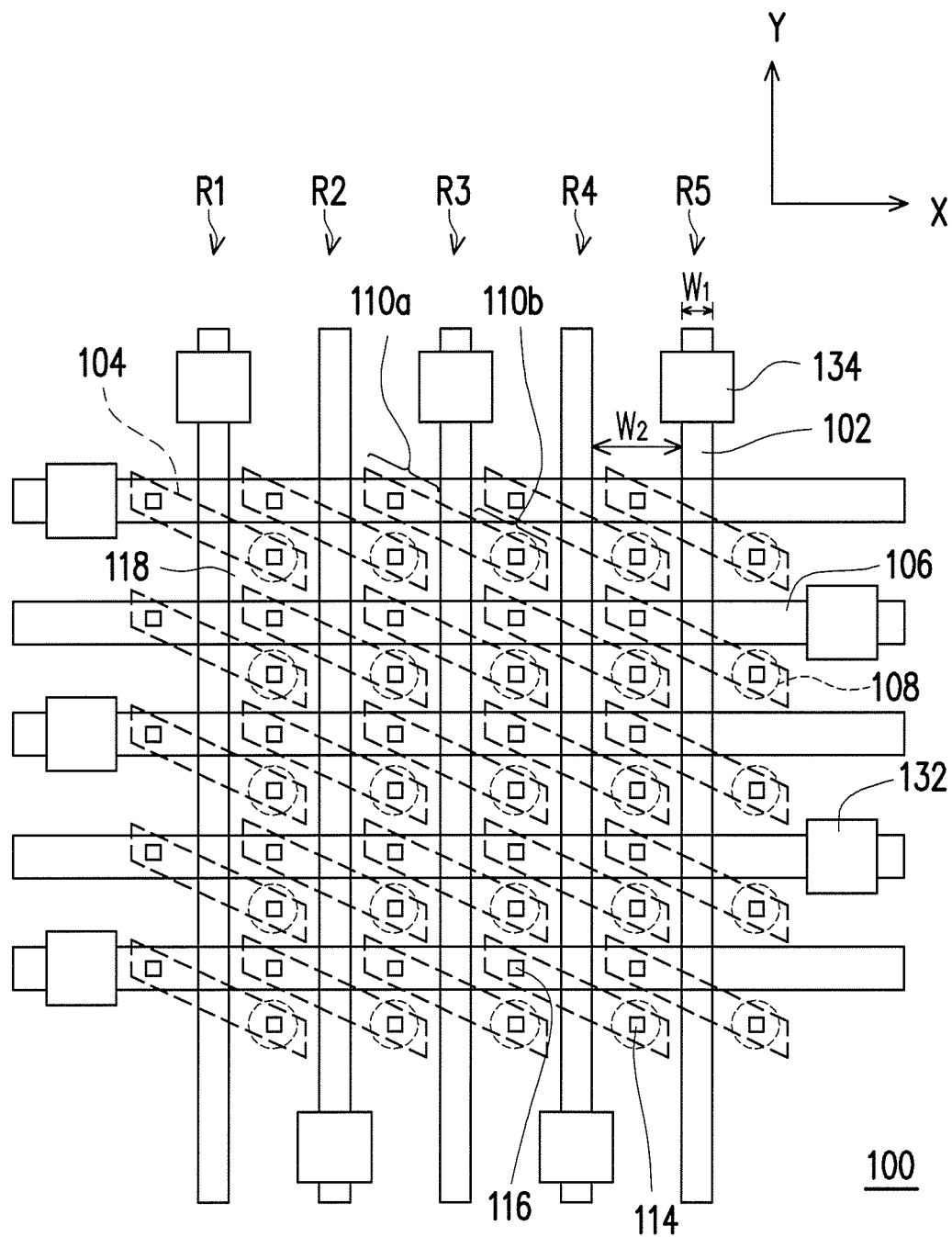
FIG. 3 is a layout diagram of a dynamic random access memory according to the third embodiment of the invention.

FIG. 3 is a layout diagram of a dynamic random access memory according to the third embodiment of the invention. Components of the third embodiment that are the same as those of the first embodiment are assigned with the same reference numerals and thus detailed descriptions thereof are omitted hereinafter. The following describes the difference therebetween.

As shown in FIG. 3, the substrate 100 includes a plurality of active areas 104. The active areas 104 are configured into strips and arranged as an array. For example, the active areas 104 are arranged into five active area columns R1-R5. In the X direction, two end parts of the active area 104 are arranged respectively in parallel to two end parts of the adjacent active area 104. Between two adjacent buried word lines 102, the second contact regions 110b of the active areas 104 in one column are arranged staggeredly with the first contact regions 110a of the active areas 104 in another column adjacent thereto in the Y direction. For example, between the active area column R1 and the active area column R2, the second contact regions 110b of the active areas 104 in the active area column R1 are arranged staggeredly with the first contact regions 110a of the active areas 104 in the active area column R2 in the Y direction; and between the active area column R2 and the active area column R3, the second contact regions 110b of the active areas 104 in the active area column R2 are arranged staggeredly with the first contact regions 110a of the active areas 104 in the active area column R3 in the Y direction. In the embodiment described above, one memory unit is formed on one active area 104, and the memory units are separated by the isolation structure 118. Therefore, interference between the memory units is reduced effectively. Moreover, between two adjacent buried word lines 102, the second contact regions 110b of the active areas 104 in one column are arranged staggeredly with the first contact regions 110a of the active areas 104 in another column adjacent thereto, by which the size of the memory is reduced.

To sum up, in the dynamic random access memory of the invention, one memory unit is formed on one active area, and the memory units are separated by the device isolation structure. Therefore, interference between the memory units is reduced effectively. In some embodiments, two adjacent buried word lines have a larger pitch therebetween. Thus, the word line pick up contacts are disposed on the edge of the memory cell array corresponding to both ends of the buried word line, so as to reduce loss when the buried word lines are broken and increase the process window for the word line pick up contacts. Moreover, in some other embodiments, if the second contact regions of the active areas in one column are arranged staggeredly with the first contact regions of the active areas in another column adjacent thereto, the size of the memory may be reduced.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:
1. A dynamic random access memory, comprising:
a substrate comprising a plurality of active areas that are configured into a strip and arranged as an array;
a plurality of isolation structures disposed in a trench of the substrate, wherein each of the isolation structures is disposed between two adjacent active areas;
a plurality of buried word lines disposed in parallel in a first direction in the trench of the substrate, wherein each of the buried word lines divides each of the active areas arranged in the same column into a first contact region and a second contact region;
a plurality of bit lines disposed in parallel in a second direction on the substrate and across the buried word lines, wherein a longitudinal direction of the active areas is non-orthogonal to the second direction, and each of the bit lines is connected with the first contact regions of the active areas arranged in the same row; and
a plurality of capacitors electrically connected with the second contact regions of the active areas respectively, wherein each of the active areas is intersected by only one of the buried word lines.
2. The dynamic random access memory according to claim 1, wherein an angle between the longitudinal direction of the active areas and the second direction is in a range of 15° to 50°.

3. The dynamic random access memory according to claim 1, wherein the adjacent active areas have a pitch of one feature size therebetween in the first direction.

4. The dynamic random access memory according to claim 1, wherein the active areas in two adjacent columns are arranged in a mirrored configuration.

5. The dynamic random access memory according to claim 4, wherein two first contact regions or two second contact regions are disposed between the adjacent buried word lines.

6. The dynamic random access memory according to claim 1, wherein a pitch between the adjacent buried word lines is greater than one feature size, and the adjacent active areas have a therebetween in the first direction.

7. The dynamic random access memory according to claim 1, wherein two end parts of one active area are arranged in parallel to two end parts of the adjacent active area in the first direction.

8. The dynamic random access memory according to claim 7, wherein the second contact regions of the active areas in one column are arranged staggeredly with the first contact regions of the active areas in another adjacent column.

9. The dynamic random access memory according to claim 1, further comprising a plurality of capacitor contacts disposed between the capacitors and the second contact regions to electrically connect the capacitors and the second contact regions.

10. The dynamic random access memory according to claim 1, further comprising a plurality of bit line contacts disposed between the bit lines and the first contact regions to electrically connect the bit lines and the first contact regions.

* * * * *